United States Patent [19]

Jay

[11] Patent Number: 4,854,165

[45] Date of Patent: Aug. 8, 1989

[54] APPARATUS FOR TESTING ELECTRICAL COMPONENTS

[75] Inventor: Steven P. Jay, Windsor, Calif.

[73] Assignee: Danford A. Jay, San Jose, Calif.

[21] Appl. No.: 56,245

[22] Filed: Jun. 1, 1987

[51] Int. Cl.⁴ .......................................... G01M 19/00
[52] U.S. Cl. ..................... 73/168; 340/644; 324/415
[58] Field of Search ............... 73/168; 340/644; 324/415; 439/638

[56] References Cited

U.S. PATENT DOCUMENTS

| | | | |
|---|---|---|---|
| 1,905,668 | 4/1933 | White | 324/415 |
| 2,478,938 | 8/1949 | Osterhus | 73/168 |
| 2,615,327 | 10/1952 | Foustern | 324/415 |
| 3,145,560 | 8/1964 | Williams | 73/49.7 |
| 3,389,600 | 6/1968 | Rau | 73/118 |
| 3,440,524 | 4/1969 | DeJarld et al. | 340/644 |
| 3,831,391 | 8/1974 | Blomstrand | 324/415 |
| 3,921,063 | 11/1975 | Helling | 324/415 |
| 3,967,495 | 7/1976 | Wesner et al. | 73/118 |
| 3,975,944 | 8/1976 | Aprill, Jr. | 73/168 |
| 4,294,109 | 10/1981 | Peters et al. | 73/168 |
| 4,333,697 | 6/1982 | Dreyer | 439/638 |
| 4,342,973 | 8/1982 | Stone et al. | 340/644 |
| 4,344,144 | 8/1982 | Damico et al. | 364/510 |
| 4,356,724 | 11/1982 | Ayoub et al. | 73/118 |
| 4,375,162 | 3/1983 | Eppley | 73/37 |
| 4,387,591 | 6/1983 | Corzine et al. | 73/168 |
| 4,494,809 | 1/1985 | Soloman | 439/638 |
| 4,598,579 | 7/1986 | Cummins et al. | 73/168 |
| 4,648,682 | 3/1987 | Tubbs | 439/638 |
| 4,722,221 | 2/1988 | Ferguson | 73/168 |

FOREIGN PATENT DOCUMENTS

| | | | |
|---|---|---|---|
| 2118088 | 10/1972 | Fed. Rep. of Germany | 73/168 |
| 0073169 | 4/1987 | Japan | 324/415 |
| 1153881 | 5/1969 | United Kingdom | 73/168 |

*Primary Examiner*—William A. Cuchlinski, Jr.
*Assistant Examiner*—Thomas B. Will
*Attorney, Agent, or Firm*—Jack M. Wiseman

[57] ABSTRACT

Apparatus for testing an electrical switch responsive to fluid under pressure and a solenoid valve that controls the flow of fluid under pressure. Fluid under pressure is injected into a socket holding the switch to be tested. The magnitude of the pressure is predetermined in accordance with the rating of the switch. An electrical circuit is connected to the switch to determine whether the switch opens and closes at the rated range of the switch. A solenoid valve communicates with the socket. Fluid under pressure is conducted along a path. The solenoid valve is disposed in the path of fluid flow to control the flow of fluid under pressure. The electrical circuit is connected to the solenoid valve to energize and deenergize the same, thereby opening and closing the valve. A meter communicating with the flow of fluid under pressure indicates whether the solenoid valve is operating properly.

7 Claims, 3 Drawing Sheets

APPARATUS FOR TESTING ELECTRICAL COMPONENTS

BACKGROUND OF THE INVENTION

The present invention relates in general to apparatus for testing electrical components, and more particularly to apparatus for testing electrical components which control the flow of fluid under pressure and for testing electrical components which are operatively responsive to fluid pressures.

Automotive transmissions include switches operatively responsive to hydraulic fluid pressures. The switches open and close at various predetermined hydraulic fluid pressures. During the change of gears and during speed variations in the automotive transmission, the hydraulic fluid pressure within the transmission changes and the switches, respectively, open and close in response to the hydraulic fluid pressure. Automotive transmissions also include solenoid valves. The energization and deenergization of the solenoid valves control the flow of fluid under pressure in the automotive transmission.

Heretofore, rebuilders of automotive transmissions tested the electrical switches operatively responsive to hydraulic fluid pressures for basic ON/OFF functions by measuring the conductance of the switches while subjecting the switches to unmetered air pressure. This arrangement was not satisfactory, since it failed to take into consideration that the electrical switches are calibrated to open and close within prescribed ranges of fluid pressure.

The U.S. patent to Ayoub et al., U.S. Pat. No. 4,356,724, issued on Nov. 2, 1982, for Apparatus and Method For Testing Transmissions, discloses an apparatus for testing automotive vehicular transmissions in which the output of the transmission under test is operatively connected to a load device. The load device provides a loading torque to the output shaft. During the test procedure, the torque converter is rotated at varying speeds while a loading torque is imparted to the output shaft. A vacuum is supplied to the vacuum modulator control of the transmission under test, and the hydraulic pressure of the transmission under test is monitored. A microcomputer controls and monitors the test procedure to determine whether the transmission upshifted or downshifted within predetermined limits.

In the U.S. patent to Wesner et al., U.S. Pat. No. 3,967,495, issued on July 6, 1976, for Instrument For Testing A Pneumatic Control System Of A Vehicle Transmission, there is disclosed a diagnostic instrument which detects and locates malfunctions in a pneumatic circuit that controls a transmission in response to the movement of an operator's shift lever. Connectors enable the coupling of pneumatic signal lever with various flow paths of the transmission control circuit. The presence or absence of pressure at various points in the control circuit is determined. Compressed air is directed to selected circuit flow paths through the test instrument and gauges in the instrument determine the magnitude of the pressure at selected points in the control circuit.

In the U.S. patent to Rau, U.S. Pat. No. 3,389,600, issued on June 25, 1968, for Fluid Pressure Testing Apparatus For Automatic Vehicle Transmission, there is disclosed apparatus for diagnosing malfunctions in the hydraulic systems in the automatic transmissions of automotive vehicles. The apparatus includes insert means communicating with gauges which indicate operating characteristics of different fluid circuits and fluid pressure control elements of the transmission.

The U.S. patent to Williams, U.S. Pat. No. 3,145,560, issued on Aug. 25, 1964, for Testing Means For Automotive Equipment, discloses an adapter for testing the operation of an automotive automatic transmission. Nozzles apply air under pressure to the open end of passages in the automatic transmission. The application of air under pressure causes elements of the transmission with which the passages communicate to operate. In this manner, the elements can be inspected.

SUMMARY OF THE INVENTION

An object of the present invention is to provide an apparatus for testing electrical components which apparatus is connected to a solenoid valve that controls the flow of fluid under pressure or an electrical switch that is operatively responsive to fluid pressures to determine whether the solenoid valve is operating properly or determining whether the electrical switch is operating properly within a predetermined range of fluid pressures.

A feature of the present invention is that the testing apparatus is employed while the automotive transmission is under repair or is being rebuilt and the components under test are removed from the automotive transmission.

Another feature of the present invention is that the electrical component testing apparatus of the present invention provides an accurate and fast procedure for testing electrical switches operatively responsive to fluid pressures for a calibrated, proper operation while the switches are removed from the automotive transmission.

Another feature of the present invention is that the testing apparatus simulates actual current loads that are experienced by the electrical switches under actual operating conditions, which is desirable for determining whether the contacts are making the proper contact engagement.

Another feature of the present invention is to provide an electrical component testing apparatus that tests the operation of a solenoid valve that controls the flow of fluid under pressure while the solenoid valve is removed from an automotive transmission.

Another feature of the present invention is that the testing apparatus is employed for the testing of possible shorts and open windings in the solenoid valves and also the testing of the conductivity of a diode within the solenoid valve.

Briefly described, the apparatus of the present invention, when employed to test an electrical switch operatively responsive to fluid under pressure, injects into a test socket, or the like, fluid under pressure over a range of preselected magnitudes of fluid pressure. The magnitudes of the fluid pressure injected into the test socket are varied to ascertain the precise point at which an electrical switch closes and opens. The readings are noted to determine whether the switch is operating properly or is not operating properly. Hence, the apparatus of the present invention is connected electrically to an electrical switch disposed within the socket or the like, which electrical switch is operatively responsive to fluid pressures. The fluid under pressure injected into the socket or the like at various magnitudes causes a properly operating electrical switch to open and close.

Indicating means on the apparatus indicates whether the electrical switch is properly operating within the range of fluid pressure at which it is rated.

The test apparatus of the present invention is also employed to test the operation of a solenoid valve. Fluid under pressure is conducted along a path. The solenoid valve is disposed in the path to control the flow of fluid. The electrical circuit is connected to the solenoid valve disposed within the test socket or the like. The electrical circuit energizes and deenergizes the solenoid valve to open and close the valve for controlling the flow of fluid along the path. A meter of the test apparatus of the present invention communicates with the path over which fluid flows to indicate whether the solenoid valve is operating properly.

While the apparatus of the present invention is disclosed as used for the testing of components of automotive transmissions, it is apparent that the testing apparatus of the present invention can be employed to test the operation of other electrical switches which are operatively responsive to fluid pressures, such as those used to test or monitor oil pressure and the like, or test the operation of other solenoid valves that control the flow of fluid under pressure.

DETAILED DESCRIPTION OF THE PREFERRED EMBODIMENT

Figure 1:
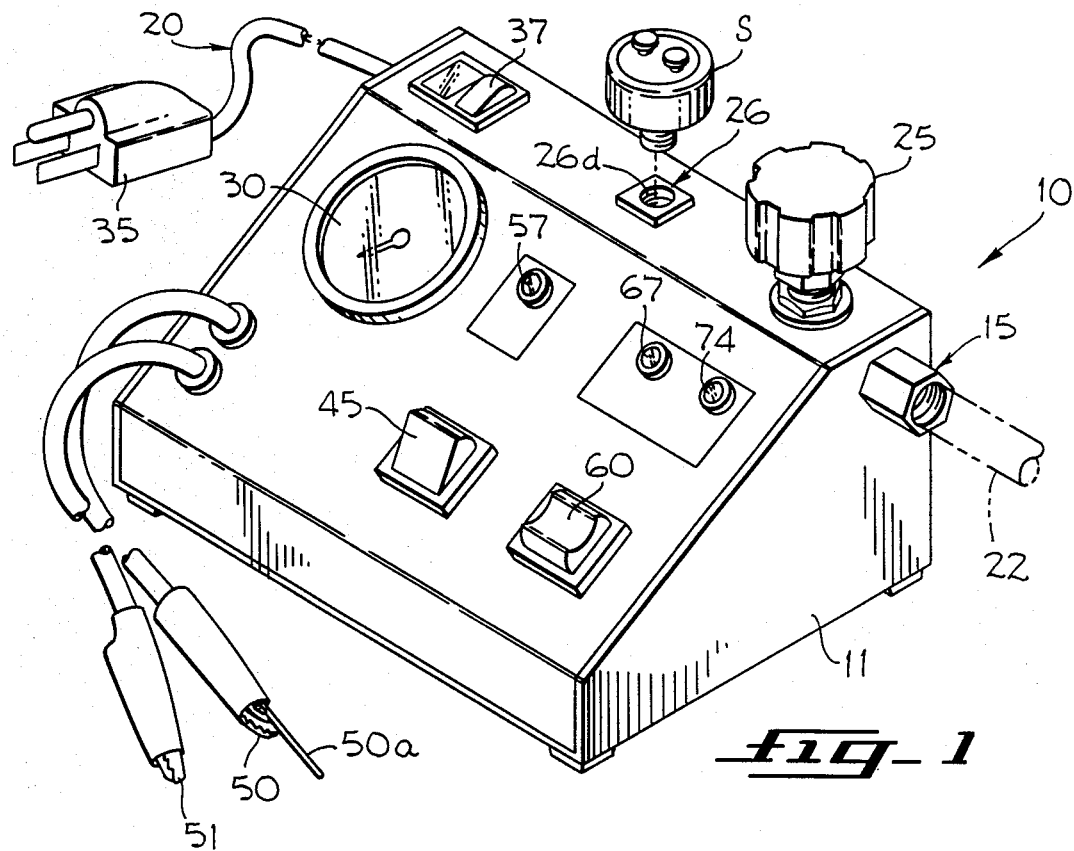
FIG. 1 is a perspective view of the apparatus of the present invention for testing electrical components.
Figure 2:
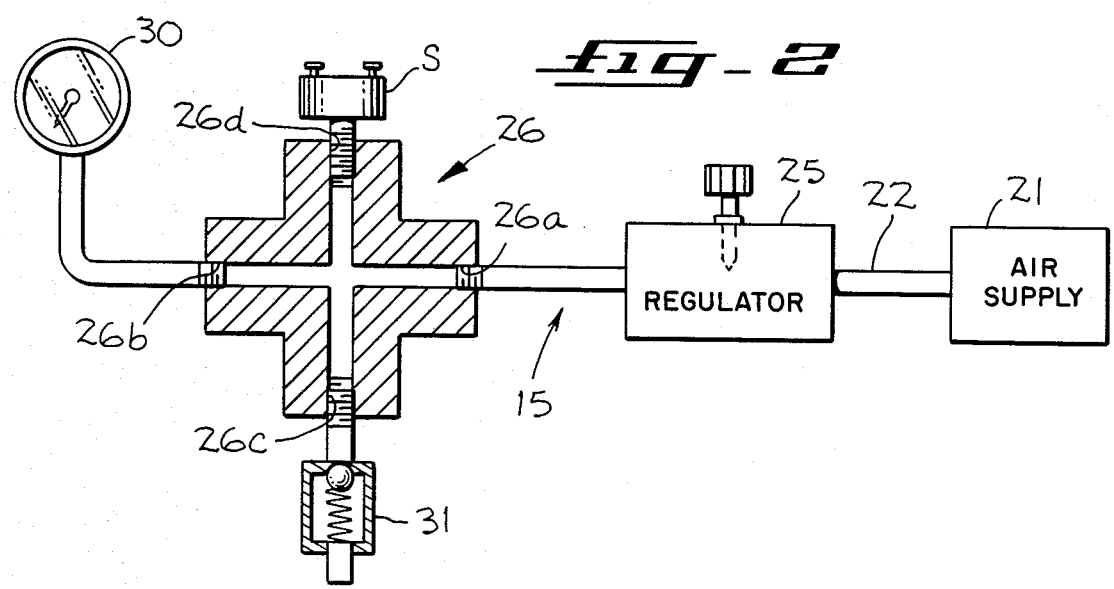
FIG. 2 is a diagrammatic illustration of a system for supplying fluid under pressure employed in the apparatus shown in FIG. 1 illustrated with an electrical switch responsive to fluid under pressure disposed in a socket thereof.

Illustrated in FIG. 1 is an apparatus 10 for testing electrical components, which comprises a suitable housing 11. Disposed within the housing 11 is a system 15 for supplying fluid under pressure (FIG. 2). In the exemplary embodiment, the system 15 provides pneumatic pressure to an electrical component, such as a switch S, which is operatively responsive to fluid pressure, or supplies fluid under pressure to a solenoid valve which controls the flow of fluid under pressure. Also disposed within the housing 11 is an electrical circuit 20 (FIG. 3) for testing the electrical operation of an electrical component under test which is subjected to fluid under pressure or for testing the operation of an electrical component which controls the flow of fluid under pressure.

The system 15 for supplying pneumatic pressure to an electrical component, such as the electrical switch S operatively responsive to fluid under pressure, comprises a suitable source 21 of air under pressure. The source 21 of air under pressure, in the exemplary embodiment, supplies pneumatic pressure in the range of 90–180 p.s.i. While the usual range of air under pressure is 90–180 p.s.i., it is apparent that the air pressure could be considerably greater or lesser than the exemplary range. Air under pressure is conducted from the source 21 of air under pressure through a conduit 22 and into a conventional pressure regulator 25. In the exemplary embodiment, the regulator 25 is manually adjusted to vary the pressure under which air flows therefrom. In practice, the regulator 25 could be in the form of a valve to adjust air flow, although the result is pressure regulation due to controlled leakage in the downstream side of the valve. Communicating with the source 21 of air under pressure through the manually adjustable regulator 25 is a suitable four port fitting 26.

An inlet port 26a of the fitting 26 communicates with the regulator 25 for receiving air under pressure. An outlet port 26b of the fitting 26 is connected to a suitable gauge 30, which gauge 30 indicates the magnitude of the pressure under which air advances through the fitting 26. A conventional relief valve 31 communicates with a port 26c of the fitting 26 to vent air under pressure exceeding allowable pressure limits to protect the gauge 30 and the electrical switch S under test from being subjected to excessive air pressure.

Formed in the fitting 26 is a socket 26d in which is disposed the electrical switch S to be tested. In the exemplary embodiment, the electrical switch S has a threaded base, which is disposed in threaded engagement with the socket 26d during the test thereof. In the exemplary embodiment, the socket 26d is threaded. Air under pressure advancing through the inlet 26a enters the socket 26d to subject the electrical switch S disposed in the socket 26d to a prescribed range of pneumatic pressures.

The electrical test circuit 20 comprises a suitable plug 35 connected to a suitable source of electrical power, not shown. The prongs of the plug 35 are connected across a primary winding of a suitable step down transformer 36 through an ON-OFF switch 37. In the exemplary embodiment, the voltage across the secondary winding of the transformer 36 is 18 volts a.c. Connected across the secondary winding of the transformer 36 is a well-known bridge rectifier 40. A capacitor 41 is connected across the output of the bridge rectifier 40 to reduce direct current ripples in the output voltage. In the exemplary embodiment, the capacitor 41 is a 470 microfarad capacitor.

Connected across the capacitor 41 is a conventional integrated circuit voltage regulator 42 of the type manufactured by Phillips ECG Semiconductor of Williamsport, Pennsylvania, as integrated circuit part number 108 or 7812. In the exemplary embodiment, the regulated output voltage for the voltage regular 42 is +12 volts and the current flow from the voltage regulator 42 is 1.5 amperes. The output of the voltage regulator is applied to a conventional double pole-double throw switch 45.

Figure 3:
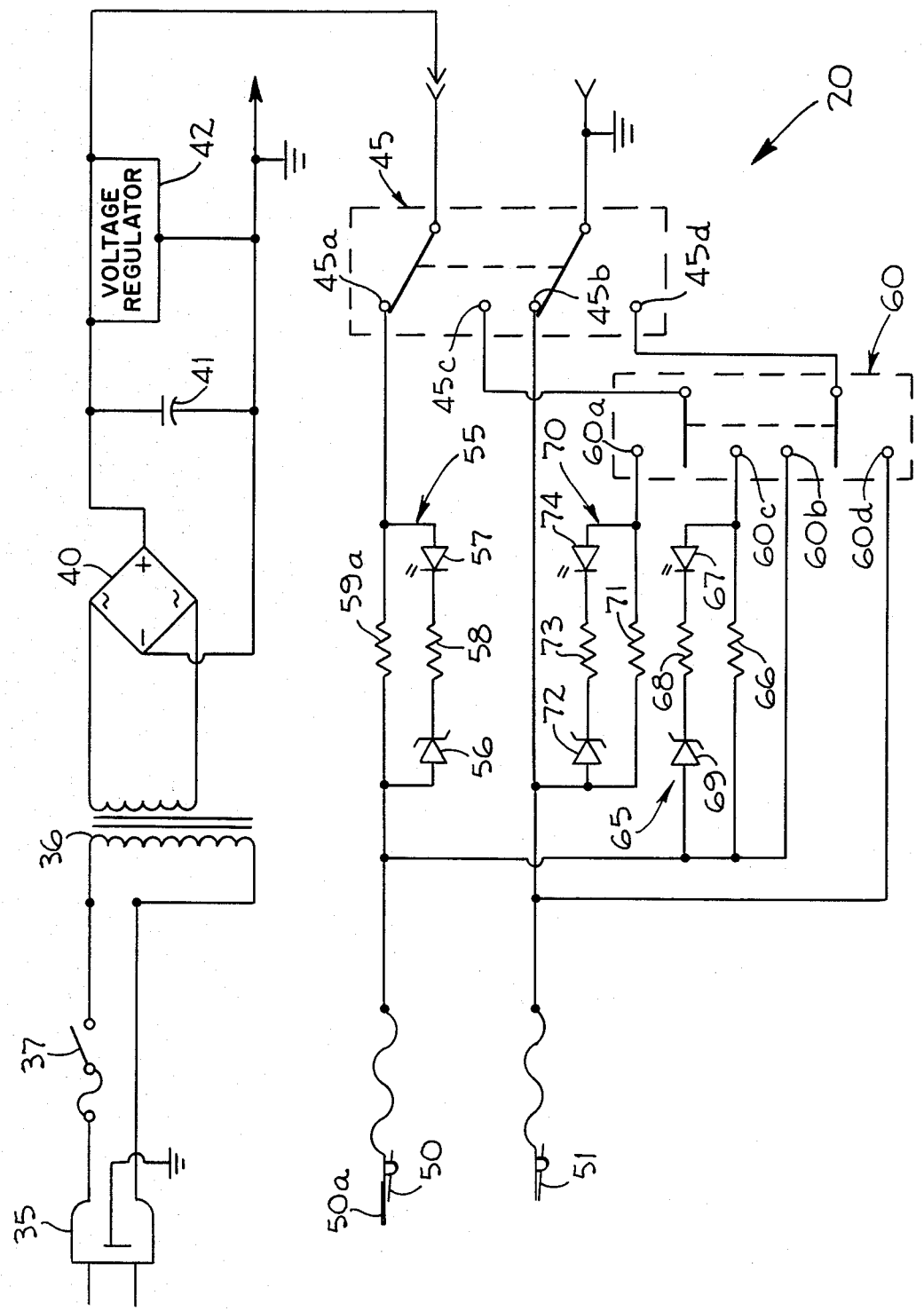
FIG. 3 is a schematic diagram of an electrical circuit employed in the apparatus shown in FIG. 1.

When a switch S operatively responsive to fluid pressures is to be tested, the switch S is disposed in threaded engagement with the socket 26d of the fitting 26 (FIG. 2). The housing 11 is at electrical ground. Hence, the fitting 26 and the socket 26d are at electrical ground. The circuit 20 includes two output terminals represented by clips 50 and 51 (FIG. 3). The clip 50 is attached to an output positive voltage conductor (FIG. 2) of the switch S under test. In the event the switch S is of a type that does not lend itself to a ground connection through the socket 26d and the housing 11, then the clip 51 is attached to the electrical ground of the electrical switch S. The base of the switch S under test is, in the exemplary embodiment, at electrical ground through the socket 2d and, hence, the ground output conductor of the switch S is at ground without the attachment of the clip 51.

When the switch S is to be tested, the switch 45 is in the position shown in FIG. 3 with the blades thereof contacting the terminals 45a and 45b. At this time, the switch S under test is closed in the exemplary embodiment. Connected to the positive voltage side of the switch 45 between the switch 45 and the clip 50 is an indicator network 55. The indicator network 55 comprises a Zener diode 56 and a light emitting diode 57. Between the Zener diode 56 and the light emitting diode 57 is a current limiting resistor 58 for protecting the light emitting diode 57. A load resistor 59a of the indicator network 55 is disposed in series with the terminal 45a and the clip 50, and also is disposed in parallel with the Zener diode 56, the light emitting diode 57 and the resistor 58.

When the switch S under test is closed, current flows through the positive terminal 45a of the switch 45, the indicator network 55, clip 50, terminal 45b of the switch and ground. When the switch S is closed, the voltage drop across the load resistor 59a is sufficient to overcome the threshold voltage of the Zener diode 56 causing the light emitting diode 57 to light. This arrangement provides an improved and more dependable indication of the operation of the switch S.

Now, the regulator 25 (FIG. 2) is adjusted so that the switch S is subjected to a range of fluid pressures to test whether it will open or close at its rated fluid pressures. Should the light emitting diode 57 remain illuminated while the switch S is subjected to the prescribed range of fluid pressures, then the switch S, in the exemplary embodiment, did not open and it is defective. Should the light emitting diode 57 be extinguished while the switch S is subjected to the predetermined range of fluid pressures, then the switch S, in the exemplary embodiment, has opened and is operating properly. When the switch S under test is opened, the voltage drop across the load resistor 59a is insufficient to overcome the threshold voltage of the Zener diode 56 and the light emitting diode 57 does not light.

During the testing of the switch S for the opening and closing thereof, the conductivity of the switch S is also being tested under simulated actual load conditions. During the introduction of fluid under pressure, the switch S is tested for possible internal fluid leaks that may cause operational problems in the transmission due to reduced or improper fluid pressures resulting from fluid leaks. Fluid leaks influence the opening and closing of the contacts of the switch under test. In the testing of switches S, it is apparent that some switches are opened when subjected to increased fluid pressure, while other switches are closed when subjected to increased fluid pressure. For purposes of brevity, the present disclosure describes one type of switch in the exemplary embodiment.

During the testing of the switch S, power is continuously supplied thereto. The light emitting diode 57 is illuminated or extinguished depending upon whether the switch S is opened or closed by the fluid under pressure. The air pressure reading at which the light emitting diode 57 goes on or off is observed and checked against the intended rated value of the switch S under test. For the light emitting diode 57 to illuminate when the contacts of the switch S are closed, the closed contacts must be capable of conducting enough current to overcome the threshold voltage of the Zener diode 56 by means of the load resistor 59. This simulation of actual operating current conditions lends itself to a high test reliability. In the switch testing mode, the apparatus 10 can be used to set or calibrate adjustable pressure switches.

In the exemplary embodiment, the flow of current through the switch 45 is 640 milliamperes while the switch S under test is closed, the resistance of the load resistor 59 is 15 ohms, the resistance of the limiting resistor 58 is 39 ohms, and the threshold voltage of the Zener diode 56 is 9 volts.

Figure 4:
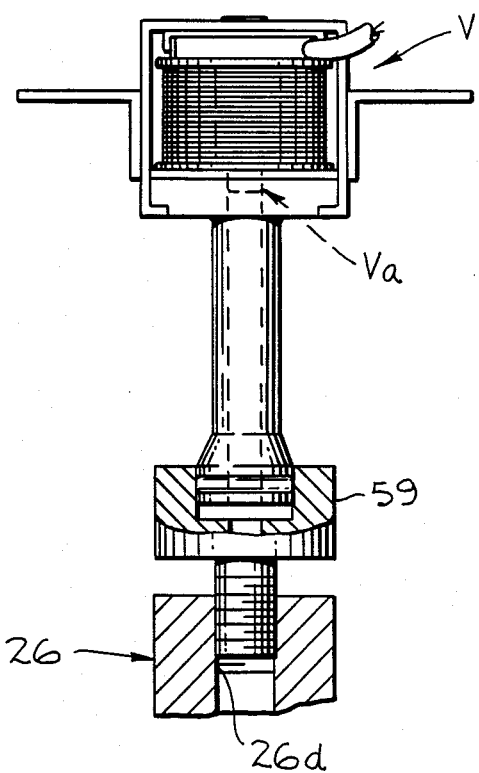
FIG. 4 is a fragmentary diagrammatic illustration of a socket and an adapter in the system shown in FIG. 2 for supplying fluid under pressure the flow of which is controlled by a solenoid valve.
Figure 5:
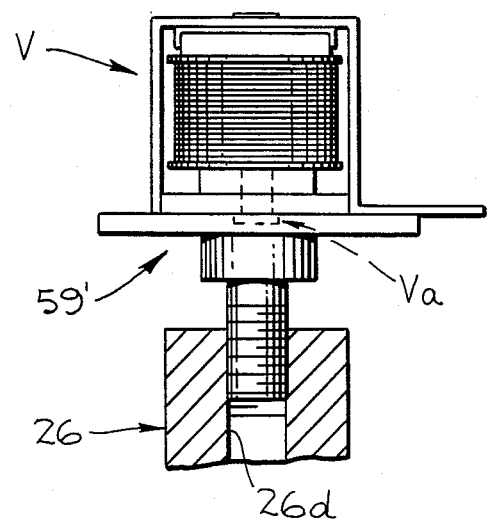
FIG. 5 is a fragmentary diagrammatic illustration of a socket and another embodiment of an adapter in the system shown in FIG. 2 for supplying fluid under pressure the flow of which is controlled by the solenoid valve.

For testing the operation of a solenoid valve V, the inlet conduit Va of a solenoid valve V (FIG. 4) is disposed within a suitable adapter 59. In the exemplary embodiment, the adapter 59 is a T-shaped adapter and is disposed in threaded engagement with the socket 26d. The adapter 59 maintains a fluid tight seat for the inlet conduit Va of the solenoid valve V while the solenoid valve V communicates with the socket 26d through the adapter 59. It is apparent that the socket 26d is exemplary and many variations for seating the electrical components may be employed, such as a test chamber. Similarly, the adapter 59 is exemplary and many variations thereof may be employed to accommodate various solenoid valves. In FIG. 5, an adapter 59' with a flat base supports the solenoid valve V while the relatively short inlet conduit Va of the solenoid valve V communicates with a central opening in the adapter 59' in fluid tight relation. A threaded conduit of the adapter 59' is disposed in threaded engagement with the socket 26d and communicates with the socket 26d and the inlet conduit Va. The clip 50 is attached to the positive voltage input conductor of the solenoid valve V under test. The clip 51 is attached to the electrical ground. In those instances in which the solenoid valve is constructed with a female electrical receptacle, a suitable probe 50a is soldered to the clip 50 for establishing an electrical connection with the positive voltage input conductor of the solenoid valve V under test by inserting the probe 50a into the female electrical receptacle of the solenoid valve V.

The regulator 25 is adjusted so that a predetermined magnitude of air under pressure enters the socket 26d through the port 26a. The solenoid valve V is arranged to control the flow of air under pressure from the socket 26d for venting the air under pressure to atmosphere through the solenoid valve V when the solenoid valve V is opened. The meter 30 indicates whether air under pressure is flowing from the socket 26d into solenoid valve V for venting to atmosphere by giving a reading of the air pressure of the flow of air through the fitting 26. When the solenoid valve V is opened, air under pressure is vented to atmosphere through the solenoid valve V. When the solenoid valve does not open, the pressure of the air builds up within the fitting 26.

When the solenoid valve V is to be tested for proper operation, the switch 45 is positioned so that the blades thereof are contacting the terminals 45c and 45d. The flow of current through the terminals 45c of the switch 45 is conducted through the double pole-double throw switch 60, which is normally spring loaded to the center OFF position. When the switch 60 is actuated to position its blades to contact terminals 60a and 60b, the flow of current through resistor 71, clip 51, solenoid valve V, clip 50, terminal 60b of the switch 60 and ground should be sufficient to energize the solenoid of the solenoid valve V. In the event the current flow is insufficient and the solenoid valve V is deenergized, the solenoid valve V is opened and air under pressure is vented to atmosphere through the inlet conduit Va allowing the flow of air under pressure through the solenoid valve V. When the current flow is sufficient to energize the solenoid valve V, the valve V closes in a well-known manner and the flow of air under pressure through the solenoid valve V is interrupted and is not able to flow through the solenoid valve V. The meter 30 gives a reading as to the pressure of the flow of air within the fitting 26 to indicate whether air is flowing through the solenoid valve V and, hence, whether the solenoid valve V is operating properly.

When the solenoid valve V is to be tested for shorts or for the conductivity of the diode of the solenoid valve V, the solenoid valve V communicates with the socket 26d of the fitting 26 by means of the suitable adapter 59 or the suitable adapter 59'. The flow of air under pressure into the fitting 26 can either continue or be interrupted. The switch 45 is actuated so that its blades contact terminals 45c and 45d. Connected to the terminals 45c and 45d of the switch 45 is the conventional double throw-double pole switch 60 (FIG. 3). The output side of the switch 60 includes terminals 60a, 60b., 60c and 60d. The blades of the switch 60 are spring loaded and contact the terminals 60a-60d for a short time duration. The blades return to a neutral position interrupting any contact with the terminals 60a-60d after contacting selected ones of the terminals 60a-60d of the switch 60 for short time durations.

When it is desired to test the solenoid valve V communicating with the socket 26d for possible shorts, the clip 50 is connected to the positive conductor of the solenoid valve V under test. The clip 51 is connected to the ground conductor of the solenoid valve V. A short indicating network 65 interconnects the clip 50 and the positive voltage terminal 60c of the switch 60. The short indicating network 65 comprises a load resistor 66, which in the exemplary embodiment, is a 4 ohm resistor. The load resistor 66 is connected in series with the positive voltage terminal 60c of the switch 60 and the clip 50. Also, the load resistor 66 is connected in parallel with a light emitting diode 67, a current limiting resistor 68 and a Zener diode 69. The current limiting resistor 68 protects the light emitting diode 67 from excessive current flow. In the exemplary embodiment, the threshold voltage of the Zener diode 69 is 2.4 volts and the resistance of the current limiting resistor 68 is 39 ohms.

When it is desired to test the solenoid valve V for shorts, the blades of the switch 60 are actuated to temporarily contact the terminals 60c and 60d. In so doing, a positive voltage, such as 12 volts, is applied to the terminal 60c. When the solenoid valve V under test is free of a short, the current flow through the load resistor 66, in the exemplary embodiment, is between 320 to 501 milliamperes. The voltage across the load resistor 66 is insufficient to overcome the threshold voltage of the Zener diode 69. Hence, the light emitting diode 67 remains extinguished and is not illuminated.

However, should the current flow through the load resistor 66, in the exemplary embodiment, exceed 650 milliamperes, then the voltage drop across the load resistor 66 is sufficient to overcome the threshold voltage of the Zener diode 69. This action causes the light emitting diode 67 to light, thus indicating a probable short in the solenoid valve V under test.

In practice, the short test is conducted simultaneously with the operational test of the solenoid valve V.

Should it be desired to test the conductivity of a diode of the solenoid valve V under test, such as PN 79601 or PN 35610 solenoid valve distributed by Aceomatic, of Culver City, California, the clip 51 is connected to the ground conductor of the solenoid valve V for establishing a ground potential connection and the clip 50 is connected to the positive potential conductor of the solenoid valve V under test. Connected in series with the terminal 60a of the switch 60 and the clip 51 is a diode indicator network 70. The diode indicator network 70 includes a load resistor 71 which is connected in series with the terminal 60a of the switch 60 and the clip 51. The load resistor 71 is also connected in parallel with a Zener diode 72, a limiting resistor 73 and a light emitting diode 74. In the exemplary embodiment, the load resistor 71 is a 15 ohm resistor, the current limiting resistor 73 is a 39 ohm resistor and the Zener diode 72 has an 8 volt threshold voltage. The current limiting resistor 73 serves to protect the light emitting diode 74 from excessive current flow.

When it is desired to test the conductivity of the diode of the solenoid valve under test, the blades of the switch 60 temporarily engage the terminals 60a and 60b.

This is a reverse current flow state with respect to the testing of the solenoid valve V for possible shorts. If the diode of the solenoid valve V is conducting properly, the voltage drop across the load resistor 71 is sufficient to overcome the threshold voltage of the Zener diode 72 and the light emitting diode 74 will be illuminated. If the voltage drop across the load resistor 71 is insufficient to overcome the threshold voltage of the Zener diode 72, then the light emitting diode 74 will not light to indicate that the conductivity of the diode of the solenoid valve V is not proper and the diode of the solenoid valve V is defective.

The indicating networks 65 and 70 provide improved and more accurate indicating circuits by virtue of a parallel connected load resistor overcoming the threshold voltage of a Zener diode, which is in series with a light emitting diode. It is apparent that the solenoid valves V may be of various designs and types and the apparatus of the present invention may be modified to accommodate such various designs and types.

What is claimed is:

1. Apparatus for testing an electrical switch operatively responsive to fluid pressure, said switch when operating properly being arranged to be actuated in response to being subjected to a predetermined fluid pressure within a prescribed range, said apparatus comprising:

(A) means communicating with said switch and conducting fluid under pressure for applying to said switch a predetermined fluid pressure within said prescribed range; and (B) electrical circuit means connected to said electrical switch for indicating whether said switch has been actuated in response to said fluid pressure within said prescribed range, (C) said electrical circuit means comprising an indicator network to indicate whether said switch has been actuated, said network comprising:

(a) a Zener diode having a threshold voltage;

(b) a light emitting diode connected to said Zener diode, said light emitting diode being illuminated in response to said Zener diode conducting and being extinguished in response to said Zener diode being in a non-conducting state; and (c) a load resistor connected to said Zener diode for controlling the conduction of said Zener diode, the current flow through said load resistor being sufficient to overcome the threshold voltage of said Zener diode in response to one state of said switch and being insufficient to overcome the threshold voltage of said Zener diode in response to another state of said switch.

2. Apparatus for testing a solenoid valve that controls the flow of fluid under pressure, said apparatus comprising:

(a) means conducting fluid under pressure along a predetermined path, said solenoid valve being disposed along said path for controlling the flow of fluid under pressure along said path;

(b) first electrical circuit means connected to said solenoid valve for controlling the operation thereof to control the flow of fluid under pressure along said path;

(c) a meter communicating with said path to indicate the flow of fluid under pressure through said solenoid valve for testing the operation of said solenoid valve;

(d) second electrical circuit means connected to said solenoid valve to indicate the presence of a short in said solenoid valve; and (e) a first switch at times connecting said first electrical circuit means to said solenoid valve for controlling the operation thereof to control the flow of fluid under pressure along said path and at other times connecting said second electrical circuit means to said solenoid valve to indicate the presence of a short in said solenoid valve.

3. Apparatus for testing a solenoid valve comprising a diode that controls the flow of fluid under pressure, said apparatus comprising:

(a) means conducting fluid under pressure along a predetermined path, said solenoid valve being disposed along said path for controlling the flow of fluid under pressure along said path;

(b) first electrical circuit means connected to said solenoid valve for controlling the operation thereof to control the flow of fluid under pressure along said path;

(c) a meter communicating with said path to indicate the flow of fluid under pressure through said solenoid valve for testing the operation of said solenoid valve;

(d) second electrical circuit means connected to said solenoid valve to indicate the conductivity of said diode; and (e) switch means at times connecting said first electrical circuit means to said solenoid valve for controlling the operation thereof to control the flow of fluid under pressure along said path and at other times connecting said second electrical circuit means to said solenoid valve to indicate the conductivity of said diode.

4. Apparatus for testing a solenoid valve comprising a diode that controls the flow of fluid under pressure, said apparatus comprising:

(a) means conducting fluid under pressure along a predetermined path, said solenoid valve being disposed along said path for controlling the flow of fluid under pressure along said path;

(b) first electrical circuit means connected to said solenoid valve for controlling the operation thereof to control the flow of fluid under pressure along said path;

(c) a meter communicating with said path to indicate the flow of fluid under pressure through said solenoid valve for testing the operation of said solenoid valve;

(d) second electrical circuit means connected to said solenoid valve to indicate the presence of a short in said solenoid valve;

(e) third electrical circuit means connected to said solenoid valve to indicate the conductivity of said diode;

(f) first switch means at times connecting said first electrical circuit means to said solenoid valve for controlling the operation thereof to control the flow of fluid under pressure along said path and at other times disconnecting said first electrical circuit means from said solenoid valve to interrupt controlling the operation of said solenoid valve in the control of the flow of fluid under pressure along said path; and (g) second switch means connected to said first switch means in response to said first switch means being disconnected from said solenoid valve for interrupting the operation of said solenoid valve is controlling the flow of fluid under pressure along said path, said second switch means at times connecting said second electrical circuit means to said solenoid valve to indicate the presence of a short in said solenoid valve and at other times connecting said third electrical circuit means to said solenoid valve to indicate the conductivity of said diode.

5. Apparatus as claimed in claim 4 wherein said second electrical circuit means comprises an indicator network to indicate the presence of a short in said solenoid valve, said network comprising:

(a) a Zener diode having a threshold voltage;

(b) a light emitting diode connected to said Zener diode, said light emitting diode being illuminated in response to said Zener diode conducting and being extinguished in response to said Zener diode being in a non-conducting state; and (c) a load resistor connected to said Zener diode for controlling the conduction of said Zener diode, the current flow through said load resistor being sufficient to overcome the threshold voltage of said Zener diode in response to the presence of a short in said solenoid valve and being insufficient to overcome the threshold voltage of said Zener diode in response to the absence of a short in said solenoid valve.

6. Apparatus as claimed in claim 4 wherein said electrical circuit means comprises an indicator network to indicate the conduction of said diode of said solenoid valve, said network comprising:

(a) a Zener diode having a threshold voltage;

(b) a light emitting diode connected to said Zener diode, said light emitting diode being illuminated in response to said Zener diode conducting and being extinguished in response to said Zener diode being in a non-conducting state; and (c) a load resistor connected to said Zener diode for controlling the conduction of said Zener diode, the current flow through said load resistor being sufficient to overcome the threshold voltage of said Zener diode in response to the conduction of the diode of said solenoid valve and being insufficient to overcome the threshold voltage of said Zener diode in response to the non-conduction of the diode of said solenoid valve.

7. Apparatus for testing an electrical switch operatively responsive to fluid pressure, said switch when operating properly being arranged to be actuated in response to being subjected to a predetermined fluid pressure, said apparatus comprising:

(A) means communicating with said switch and conducting fluid under pressure for applying to said switch a predetermined fluid pressure; and (B) electrical circuit means connected to said electrical switch for indicating whether said switch has been actuated in response to said fluid pressure, (C) said electrical circuit means comprising an indicator network to indicate whether said switch has been actuated, said network comprising:

(a) a Zener diode having a threshold voltage;

(b) a light emitting diode connected to said Zener diode, said light emitting diode being illuminated in response to said Zener diode conducting and being extinguished in response to said Zener diode being in a non-conducting state; and (c) a load resistor connected to said Zener diode for controlling the conduction of said Zener diode, the current flow through said load resistor being sufficient to overcome the threshold voltage of said Zener diode in response to one state of said switch and being insufficient to overcome the threshold voltage of said Zener diode in response to another state of said switch.

* * * * *